United States Patent
Henry et al.

(10) Patent No.: US 6,768,355 B1
(45) Date of Patent: Jul. 27, 2004

(54) TRANSIENT REJECTING CIRCUIT

(75) Inventors: Paul M. Henry, Tucson, AZ (US);
Gregory J. Smith, Tucson, AZ (US);
John W. Oglesbee, Watkinsville, GA (US)

(73) Assignee: National Semiconductor Corporation, Inc., Santa Clara, CA (US)

( * ) Notice: Subject to any disclaimer, the term of this patent is extended or adjusted under 35 U.S.C. 154(b) by 0 days.

(21) Appl. No.: 09/848,625

(22) Filed: May 3, 2001

(51) Int. Cl.[7] .................... H03K 17/22; H03K 17/20
(52) U.S. Cl. ................. 327/143; 327/198; 361/111; 365/228
(58) Field of Search ................. 327/310, 142, 327/143, 198; 361/111; 365/226, 228

(56) References Cited

U.S. PATENT DOCUMENTS

| | | | | |
|---|---|---|---|---|
| 4,495,536 A | | 1/1985 | Bynum ........................ 361/58 |
| 4,649,291 A | * | 3/1987 | Konishi ...................... 327/541 |
| 4,902,910 A | * | 2/1990 | Hsieh ......................... 327/143 |
| 5,140,177 A | * | 8/1992 | Suda et al. ................. 327/198 |
| 5,598,124 A | * | 1/1997 | Kirchhoff ................... 327/552 |
| 5,608,684 A | * | 3/1997 | Reasoner et al. ........... 365/228 |
| 5,732,028 A | * | 3/1998 | Shin ........................... 327/540 |
| 5,844,429 A | * | 12/1998 | Cho ............................ 327/143 |
| 5,847,586 A | * | 12/1998 | Burstein et al. ............ 327/143 |
| 5,999,039 A | * | 12/1999 | Holst et al. ................ 327/198 |
| 6,259,284 B1 | * | 7/2001 | Hwang et al. ............. 327/142 |
| 6,259,285 B1 | * | 7/2001 | Woods ....................... 327/143 |
| 6,281,723 B1 | * | 8/2001 | Tailliet ...................... 327/143 |
| 6,469,552 B2 | * | 10/2002 | Ohbayashi et al. ........ 327/143 |
| 6,650,191 B2 | * | 11/2003 | Branch et al. ............... 331/57 |

* cited by examiner

*Primary Examiner*—Timothy P. Callahan
*Assistant Examiner*—Terry L. Englund
(74) *Attorney, Agent, or Firm*—Mark R. Hennings; Merchant & Gould

(57) ABSTRACT

A transient rejecting system for protecting the state of a memory is described. The transient rejecting system includes a signal transfer circuit and a charge storage circuit coupled to at least one pin of a circuit. The signal transfer circuit receives a supply signal and determines when a transient event occurs. When a transient event occurs, the charge storage circuit provides a signal to the pin of the circuit maintaining the state of the memory prior to the transient. During normal operation, the charge storage circuit is charged, and the supply signal is provided to the pin of the memory circuit. P-channel FETs are used in the signal transfer circuit and allow for low voltage operation of the transient rejecting system.

14 Claims, 10 Drawing Sheets

TRANSIENT REJECTING CIRCUIT

FIELD OF THE INVENTION

The present invention is related to electronic circuits, and more specifically to transient rejecting circuits.

BACKGROUND OF THE INVENTION

Many electronic circuits are subjected to transients that may adversely affect their intended operation. In lithium ion battery backs, for example, a transient may affect a battery protection circuit. The protection circuit generally attempts to maintain a "memory" of the state of charging or discharging of the lithium ion battery. When a transient occurs, the memory of the state may be lost.

Additionally, parasitic inductors may be created by the connection of the battery protection circuit to the battery pack and may create large voltage transients when exposed to those currents. The transients can be large enough to cause the effective voltage powering the protection circuit to go to zero, or even go negative for short periods of time, potentially resulting in the memory of the state of charging or discharging of the lithium ion battery to be lost.

Briefly described, the present invention is directed at providing an apparatus and method that maintains previous operational states of a memory circuit during a transient.

According to one aspect of the invention, the apparatus consists of a transient rejecting circuit that during a transient event supplies a signal that maintains the signal at a pin of a circuit.

According to another aspect of the invention, the clear pin of a memory circuit is protected from a loss of signal or an erroneous signal such that, when the induced transient event abates, the memory element is not inadvertently reset.

According to yet another aspect of the invention, the transient rejecting circuit includes a signal transfer circuit and a charge storage circuit. The signal transfer circuit supplies a signal to a pin of a circuit during normal operation, and turns off during transient events. During a transient event, the charge storage circuit supplies the signal to the pin of the circuit.

According to yet another aspect of the invention, the transient rejecting circuit protects a logic pin of the circuit from a transient event. A charge storage circuit charges to the logic signal during normal operation and maintains the logic signal at the pin of the circuit during the transient event.

According to still yet another aspect of the invention, multiple transistors are included in the signal transfer circuit to help ensure that the channel-body diode of the transistors does not drain current from the charge storage circuit. The transistors are connected in series with their body connection connected to the source, helping to ensure that any charging or discharging of the capacitor through the body path is prevented.

DETAILED DESCRIPTION OF THE PREFERRED EMBODIMENT

Figure 1:
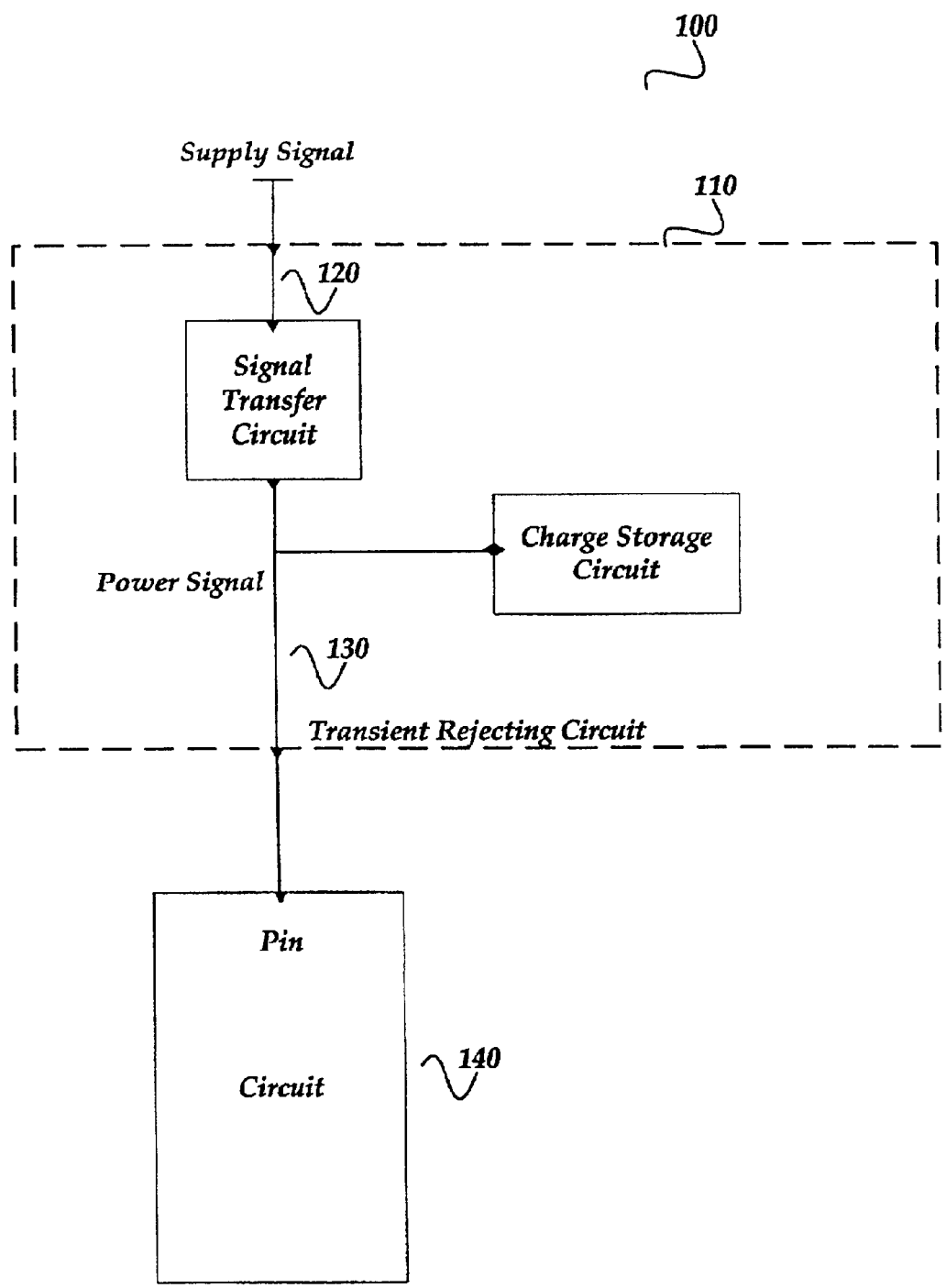
FIG. 1 shows an overview schematic diagram of a transient rejecting system.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. The term "transient event" means the signal goes sharply lower, goes to zero, or even goes negative for a short period of time. Referring to the drawings, like numbers indicate like parts throughout the views.

Briefly described, the present invention is directed at providing a method and apparatus that maintains the previous operational states of a circuit when a transient event causes the power supply for the circuit to be driven to zero or negative for a short period of time.

FIG. 1 illustrates an overview schematic diagram of a transient rejecting system according to one embodiment of the invention. As shown in the figure, transient rejecting system 100 includes transient rejecting circuit (TRC) 110 and circuit 140. TRC 110, as shown in the figure, includes a signal transfer circuit and a charge storage circuit.

TRC 110 includes an input port coupled to a supply signal, and an output port coupled to a pin of circuit 140. Node 120 is coupled between the input port of TRC 110 and the input port of the signal transfer circuit. The signal transfer circuit includes an input port coupled to node 120, and an output coupled to node 130. Charge storage circuit has an input/output coupled to node 130. Node 130 is coupled to the output port of TRC 110. The pin of circuit 140 is coupled to the output port of TRC 110.

TRC 110 determines when a transient event occurs and provides a signal to circuit 140 to maintain the state of the memory of circuit 140 during the transient event. According to one embodiment, the signal transfer circuit determines when the transient event occurs.

During normal operation (i.e. when a transient event is not occurring), the signal transfer circuit provides a power signal at node 130 that is received by the charge storage circuit and circuit 140. The charge storage circuit charges to the supply signal while the signal transfer circuit is providing the power signal.

When a transient event occurs, the signal transfer circuit stops providing the power signal at node 130. During the transient event, the charge storage circuit provides a power signal at node 130 that is received by the pin of the memory circuit. The charge storage circuit is designed to hold enough charge to supply a sufficient power signal to the pin of circuit 140 during the transient event. For some types of circuits the transient event may be very small and will require a smaller charge to be stored by the charge storage circuit than for larger transient events.

Figure 2:
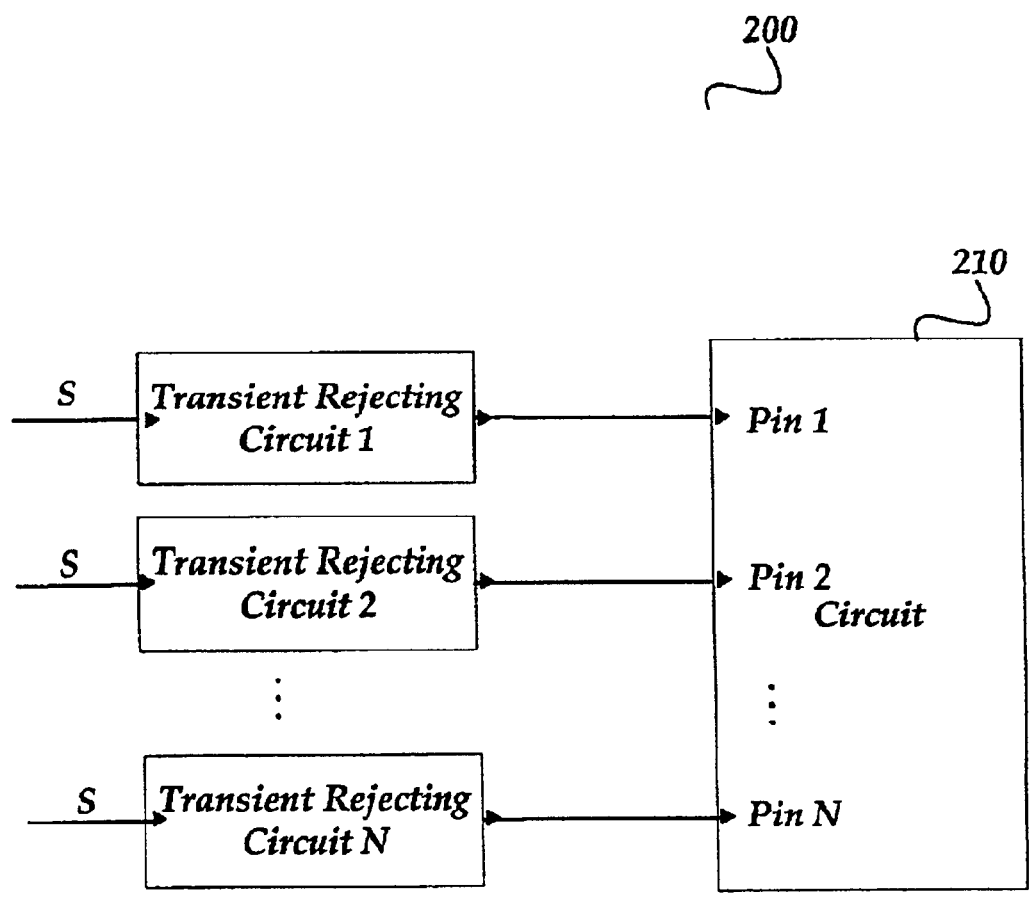
FIG. 2 shows a schematic diagram of a transient rejecting system including N transient rejecting circuits (TRCs) providing transient protection for N pins of a circuit.

FIG. 2 shows a schematic of a transient rejecting system including N TRCs providing transient protection for N pins of a memory circuit, according to one embodiment of the invention. As shown in the figure, transient rejecting system 200 includes N transient rejecting circuits, and circuit 210 having N pins.

According to one embodiment of the invention, a TRC is supplied for each pin of circuit 210 where transient protection is desired. TRC 1 is coupled to pin 1 on the memory circuit. TRC 2 is coupled to pin 2 on the memory circuit. Similarly, TRCs 3–N are connected to pins 3–N on the memory circuit. As will be appreciated, the TRCs may be coupled to the Pins 1–N in an order. For example, TRC 1 may be coupled to any of pins 1–N on circuit 210.

TRCs 1–N have an input coupled to an incoming signal (S). Alternatively, the incoming signal (S) may be a different incoming signal for each TRC (not shown).

TRCs 1–N provide a signal to pins 1–N in order to keep the state of memory for circuit 210 during normal operation and when a transient event is occurring (See FIGS. 1, 3–8, and related discussion). According to this particular embodiment, each pin of a circuit may be protected from transients.

Figure 3:
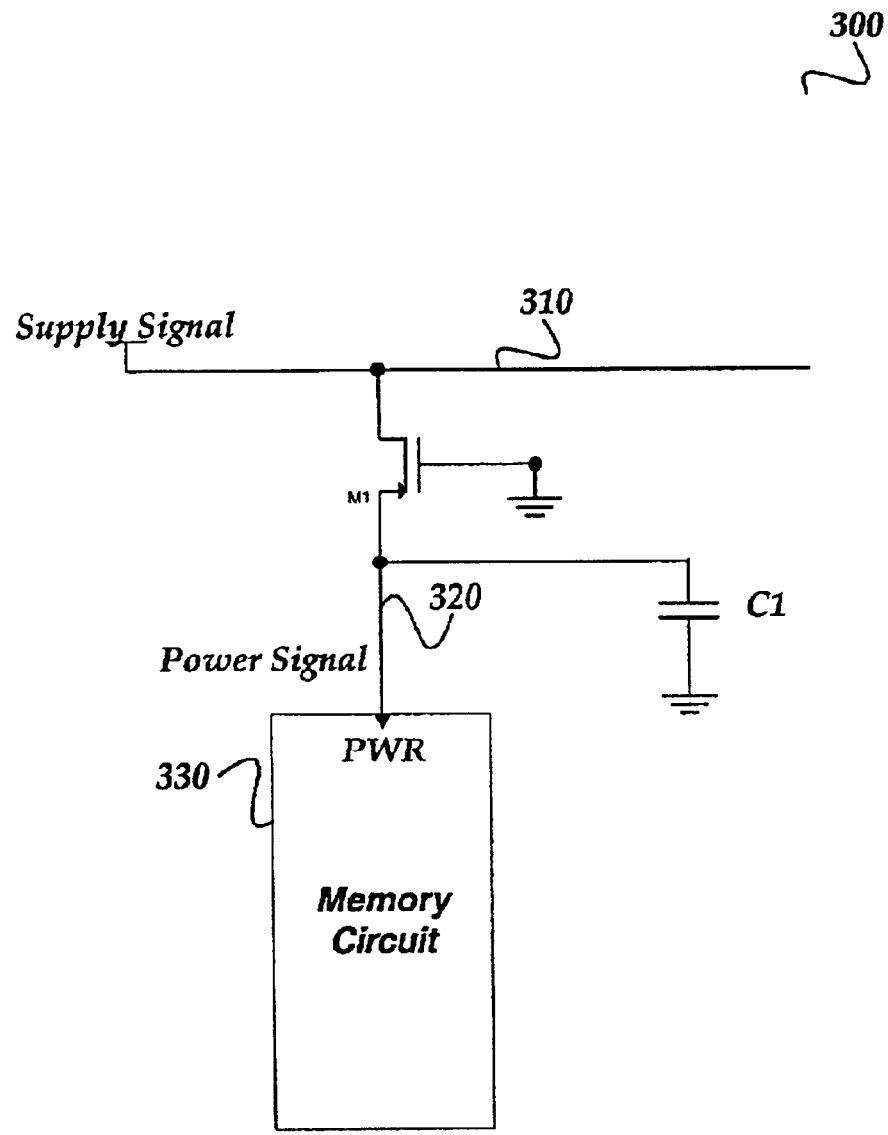
FIG. 3 shows a schematic diagram of a transient rejecting system protecting a power pin of a circuit.

FIG. 3 shows a schematic of a TRC protecting a power pin of a memory circuit, according to one embodiment of the invention. As shown in the figure, TRC circuit 300 includes, transistor M1, capacitor C1, and memory circuit 330.

Transistor M1 has a drain connected to node 310, a gate connected to ground, and a source connected to node 320. According to another embodiment, the body connection of transistor M1 may be connected to the source of transistor M1 (not shown). A supply signal is coupled to node 310. Capacitor C1 is connected between ground and node 320. The PWR pin of memory circuit 330 is connected to node 320.

According to one embodiment of the invention, transistor M1 is a P-channel FET. During normal operation, transistor M1 conducts (turns on), and couples a power signal to node 320 that is received by capacitor C1 and the PWR pin of memory circuit 330. Capacitor C1 charges to the supply signal while M1 conducts.

When a transient event occurs and the supply signal collapses, transistor M1 stops conducting (turns off) because it does not have enough Vgs to conduct. During the transient event, capacitor C1 provides a power signal at node 320 and supplies enough power to maintain the state of the PWR pin of memory circuit 330. Capacitor C1 holds enough charge to maintain the signal at the PWR pin for the period of the transient event.

According to another embodiment, transistor M1 may be replaced by a diode (not shown). Although transistor M1 is shown as a P-channel FET, transistor M1 may be an NPN transistor, a PNP transistor, a Bipolar device, a MOS device, a GaAsFET device, a JFET device, as well as one or more components that are arranged to provide the function of transistor M1 in the above described example.

Figure 4:
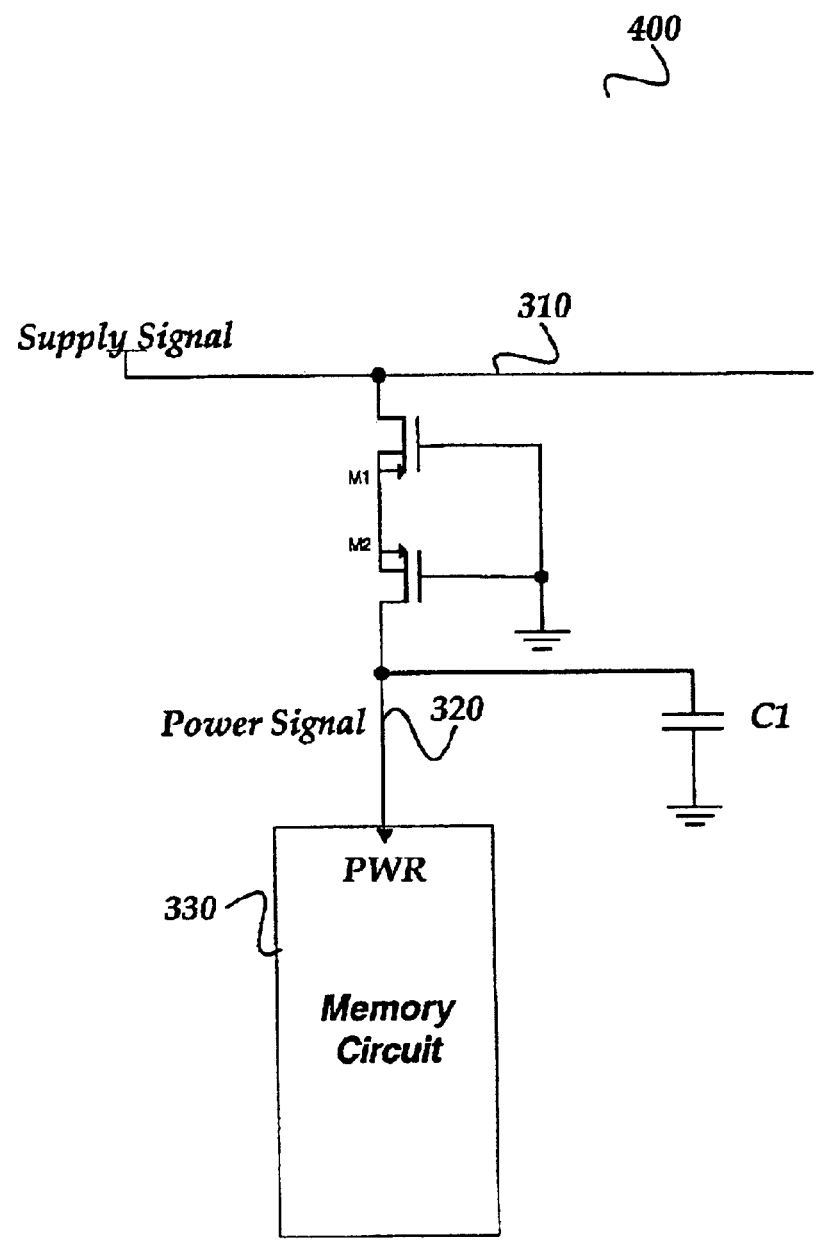
FIG. 4 shows a schematic diagram of a transient rejecting system including a drain preventing circuit for protecting a power pin of a circuit.

FIG. 4 shows a schematic diagram of a transient rejecting circuit for protecting a power pin of a circuit that is substantially similar to the transient rejecting system shown in FIG. 3. However, in this case, transient rejecting circuit 400 includes a drain preventing circuit. As shown in the figure, TRC circuit 400 includes transistors M1 and M2, capacitor C1, and memory circuit 330.

Transistors M1 and M2 are connected in series. Transistor M1 has a drain connected to node 310, a source connected to the source of transistor M2, a gate connected to ground, and a body connection connected to the source of M1. Transistor M2 has a source connected to the source of transistor M1, a drain connected to node 320, a gate connected to ground, and a body connection connected to the source of M2. A supply signal is coupled to node 310. Capacitor C1 is coupled between ground and node 320. The PWR pin of memory circuit 330 is coupled to node 320.

According to one embodiment of the invention, transistors M1 and M2 are P-channel FETs. During normal operation, transistors M1 and M2 are on (conducting) and are arranged to provide a power signal at node 320 received by capacitor C1 and the PWR pin of memory circuit 330. Capacitor C1 charges to the supply signal while transistors M1 and M2 are on.

When a transient event occurs and the supply signal collapses, transistors M1 and M2 turn off because they do not have enough Vgs to conduct. During the transient event, capacitor C1 provides a power signal at node 320 sufficient to maintain the state of the PWR pin of memory circuit 330.

According to one embodiment, two P-channel FETs are used to help ensure that the channel-body diode does not drain current from capacitor C1. Using back-to-back transistors with the body connection connected to the source helps to ensure that any charging or discharging of capacitor C1 through the body path of the transistors is prevented.

According to another embodiment, transistors M1 and M2 may be replaced by a diode (not shown). Although transistors M1 and M2 are shown as P-channel FETs, they may be NPN transistors, PNP transistors, Bipolar devices, MOS devices, GaAsFET devices, JFET devices, as well as one or more components that are arranged to provide the function of transistors M1 and M2 in the above described example.

Figure 9:
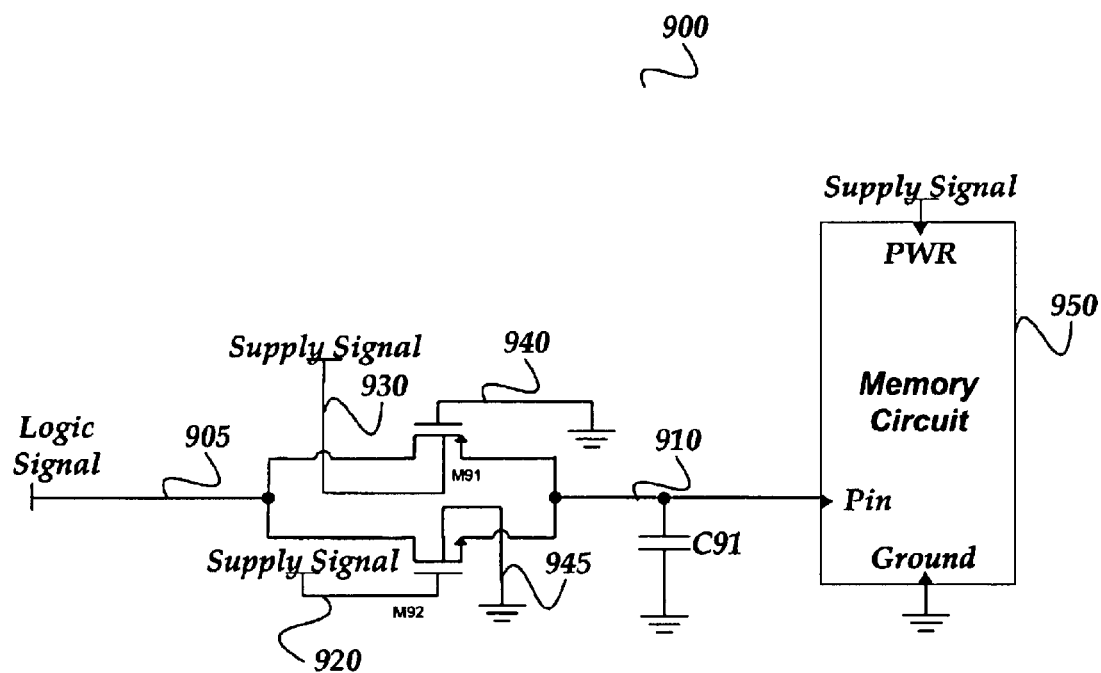
FIG. 9 shows a schematic diagram of a transient rejecting system for protecting a logic pin of a circuit.

FIG. 9 shows a schematic diagram of a transient rejecting system for protecting a logic pin of a circuit, according to one embodiment of the invention. As shown in the figure, transient rejecting system 900 includes transistor circuits M91 and M92, capacitor circuit 91, and memory circuit 950.

Transistor M91 has a drain coupled to node 905, a source coupled to a node 910, a gate coupled to node 940, and a body connection coupled to node 930. Transistor M92 has a drain coupled to node 905, a source coupled to node 910, a gate coupled to node 920, and a body connection coupled to node 945. Capacitor circuit C91 is coupled between ground and node 910. The Pin of Memory circuit 950 is coupled to node 910, the PWR input of memory circuit is coupled to a supply signal, and the ground pin is coupled to ground. An input logic signal is coupled to node 905. A supply signal is coupled to node 920 and node 930. A ground is coupled to node 940.

During normal operation, p-type transistor M91 and n-type transistor M92 act as a complementary switch and output a logic high ("1") or low ("0") output logic signal to the Pin of memory circuit 950. For example, the pin may be a set or reset, or clear or preset pin. Capacitor circuit C91 charges to the output logic signal during normal operation.

When a transient event occurs, and the supply signal collapses, capacitor circuit C91 provides a secondary logic signal at node 910, maintaining the output logic signal at node 910, ensuring that the pin of memory circuit 950 does not inadvertently change logic states. Accordingly, capacitor C91 should be sized to hold enough charge to maintain the secondary logic signal for the period of time of the transient event.

It will be appreciated in view of the present disclosure that transistors M91 and M92, may be NPN transistors, PNP transistors, Bipolar devices, GaAsFET devices, MOS devices, JFET devices, as well as one or more components that are arranged to provide the function of transistors M91 and M92 in the above described example.

Figure 10:
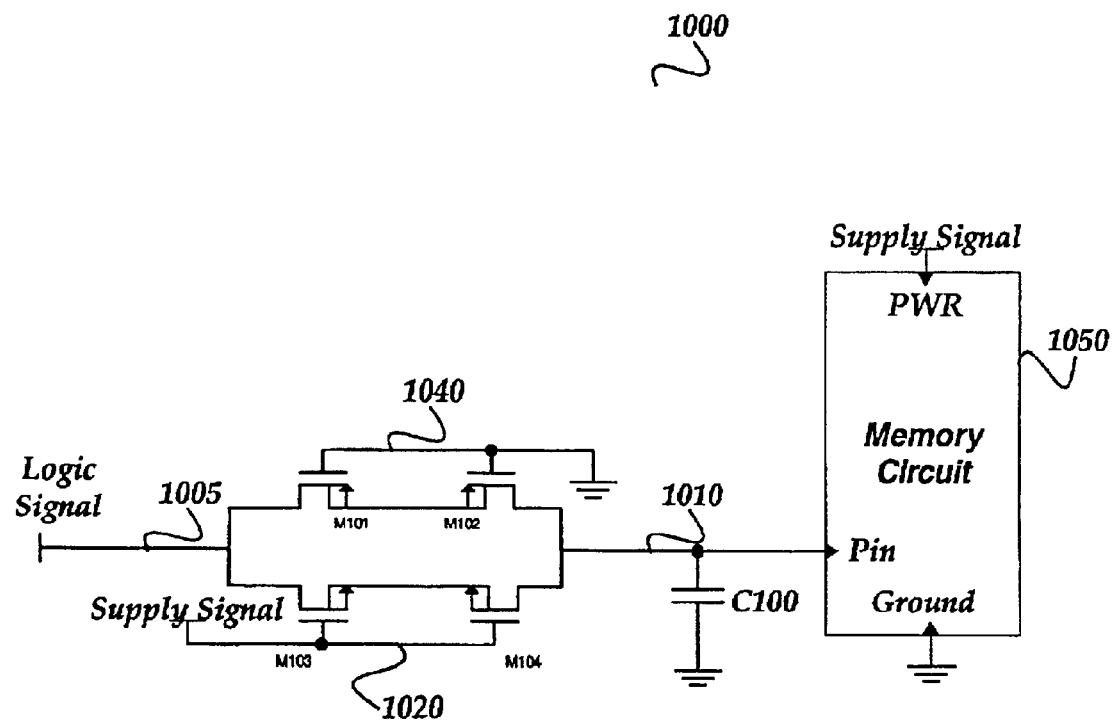
FIG. 10 shows a schematic diagram of a transient rejecting system for protecting a logic pin of a circuit including a drain preventing circuit, according to an embodiment of the invention.

FIG. 10 shows a schematic diagram of a transient rejecting system for protecting a logic pin of a circuit, according to an embodiment of the invention. As shown in the figure, transient rejecting system 1000 includes transistor circuits M101, M102, M103, and M104, capacitor circuit C100, and memory circuit 1050.

According to this embodiment, p-type transistors M101 and M102 are connected in series. Transistor M101 has a drain connected to node 1005, a source connected to the source of transistor M102, a gate connected to node 1040, and a body connection connected to the source of transistor M101. Transistor M102 has a drain connected to node 1010, a source connected to the source of transistor M101, a gate connected to node 1040, and a body connection connected to the source of transistor M102.

Similarly, n-type transistors M103 and M104 are connected in series. Transistor M103 has a drain connected to node 1005, a source connected to the source of transistor M104, a gate connected to node 1020, and a body connection connected to the source of transistor M103. Transistor M104 has a drain connected to node 1010, a source connected to the source of transistor M103, a gate connected to node 1020, and a body connection connected to the source of transistor M104.

Capacitor circuit C100 is coupled between ground and node 1010. The Pin of Memory circuit 1050 is coupled to node 1010, the PWR input of memory circuit is coupled to a supply signal, and the ground pin is coupled to ground. An input logic signal is coupled to node 1005. A supply signal is coupled to node 1020. A ground is coupled to node 1040.

During normal operation, p-type transistors M101 and M102 and n-type transistors M103 and M104 act as a complementary switch and output a logic high ("1") or low ("0") output logic signal to the Pin of memory circuit 1050. For example, the pin may be a set or reset, or clear or preset pin. Capacitor circuit C100 charges to the output logic signal during normal operation.

When a transient event occurs, and the supply signal collapses, capacitor circuit C100 provides a secondary logic signal at node 1010, maintaining the output logic signal at node 1010, ensuring that the pin of memory circuit 1050 does not inadvertently change logic states. Accordingly, capacitor C100 should be sized to hold enough charge to maintain the secondary logic signal for the period of time of the transient event.

The transistor pairs (M101 and M102, and M103 and M104) are connected in series to help ensure that the channel-body diode does not drain current from capacitor circuit C100. Using back-to-back transistors with the body connection connected to the source helps to ensure that any charging or discharging of capacitor C100 through the body path of the transistors is prevented.

It will be appreciated in view of the present disclosure that transistors M101, M102, M103, and M104 may be NPN transistors, PNP transistors, Bipolar devices, MOS devices, GaAsFET devices, JFET devices, as well as one or more components that are arranged to provide the function of transistors M101, M102, M103, and M104 in the above described example.

Figure 5:
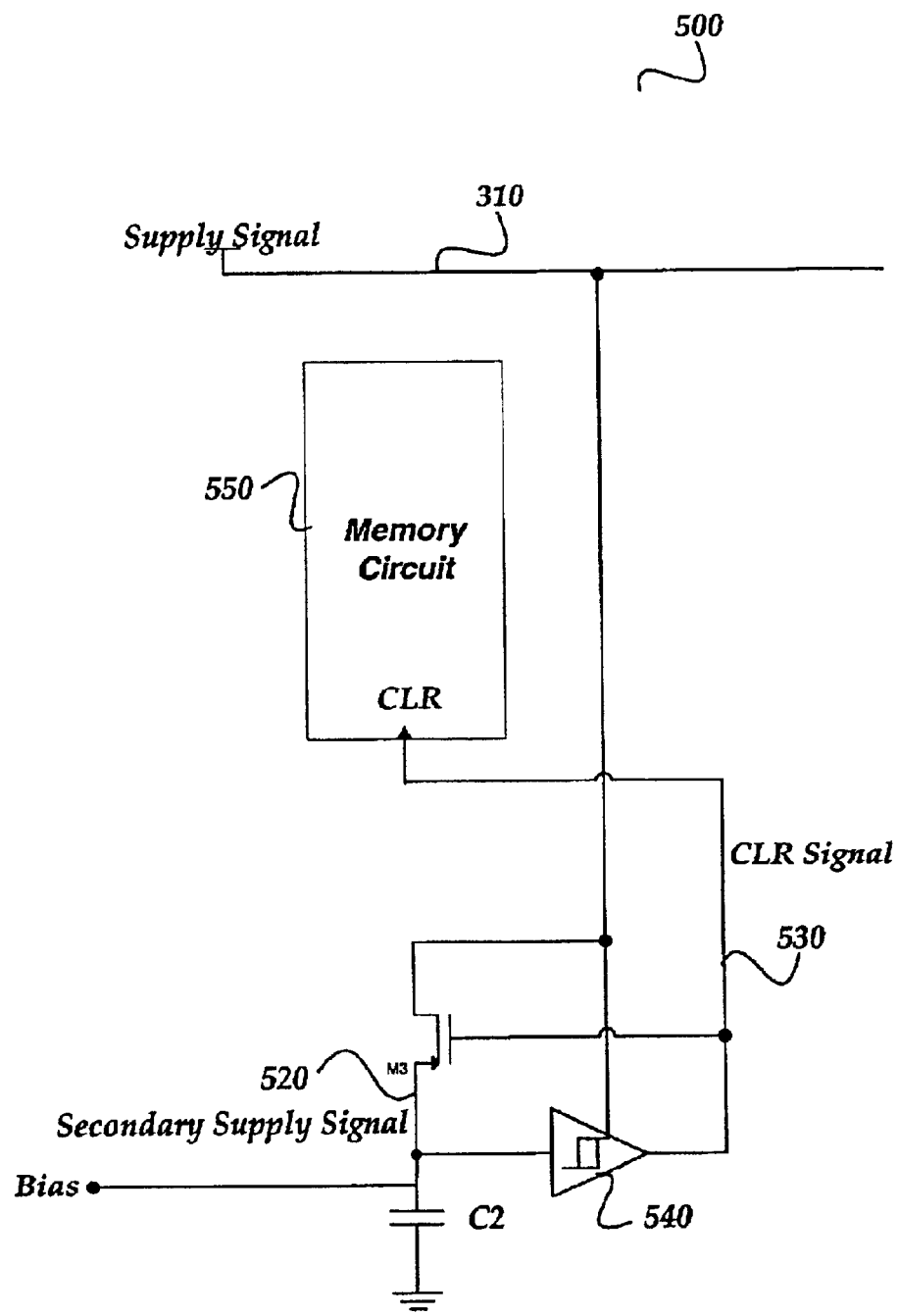
FIG. 5 shows a schematic diagram of a transient rejecting system protecting a clear pin of a circuit.

FIG. 5 illustrates a schematic of a TRC protecting a clear pin of a memory circuit, according to one embodiment of the invention. As shown in the figure, TRC 500 includes transistor M3, Schmidt trigger 540, capacitor C2, and memory circuit 550.

Transistor M3 has a source connected to node 520, a drain connected to node 310, and a gate connected to node 530. According to another embodiment, the body connection of transistor M3 may be connected to the source connection (not shown). Capacitor C2 is coupled between node 520 and ground. Schmidt trigger 540 is coupled between node 520 and node 530. The CLR pin of memory circuit 550 is coupled to node 530. A bias is coupled to node 520. A supply signal is coupled to node 310.

At startup of TRC 500, capacitor C2 begins charging to the bias signal. Initially, capacitor C2 has no stored charge such that the input of Schmidt trigger 540 is below a first trip point and Schmidt trigger 540 produces a high (logic "1") CLR signal at node 530. While the CLR signal at node 530 is high, transistor M3 does not have enough Vgs to conduct and is off. Similarly, the CLR pin of memory circuit 550 is held high by the high CLR signal at node 530, resetting memory circuit 550. When capacitor C2 is charged to the first trip level of Schmidt trigger 540, Schmidt trigger 540 produces a low (logic "0") CLR signal at node 530. Once the Schmidt trigger 540 produces a low CLR signal, the CLR pin of memory circuit 550 is held low, transistor M3 turns on (conducts) and couples the supply signal to node 520. Capacitor C2 charges to the supply signal while transistor M3 is on.

When a transient event occurs, and the supply signal collapses, capacitor C2 provides a secondary supply signal at node 520 and node 310, maintaining the input of Schmidt trigger 540 above the second trip point. The output of Schmidt trigger 540 is held low ensuring that the CLR pin of memory circuit 550 is not inadvertently reset. Accordingly, capacitor C2 should be sized to hold enough charge to maintain the secondary supply signal for the period of time of the transient event. According to this embodiment, the CLR input of memory circuit 550 is protected from a loss of signal or an erroneous signal such that, when the induced transient event abates, the memory element is not inadvertently rest.

According to another embodiment, transistor M3 may be replaced by a diode (not shown) and a one trip level inverter may replace Schmidt trigger 540. Similarly, although transistor M3 is shown as a P-channel FET, transistor M3 may be an NPN transistor, a PNP transistor, a Bipolar device, a MOS device, a GaAsFET device, a JFET device, as well as one or more components that are arranged to provide the function of transistor M3 in the above described example.

Figure 6:
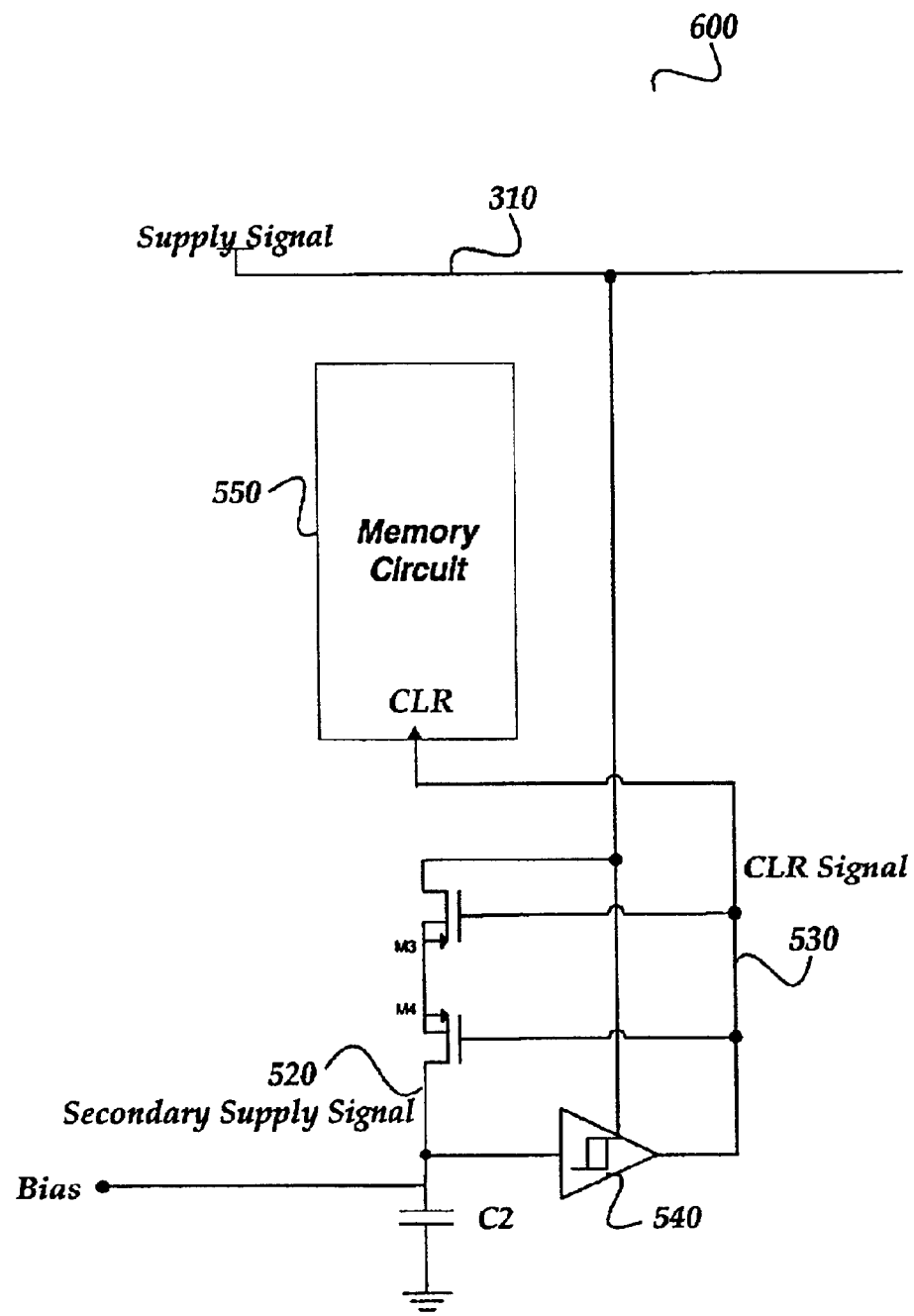
FIGS. 6 shows a schematic diagram of a transient rejecting system including a drain preventing circuit for protecting a clear pin of a circuit.

FIG. 6 shows a schematic diagram of a transient rejecting circuit for protecting a clear pin of a circuit that is substantially similar to the transient rejecting system shown in FIG. 5. However, in this case, transient rejecting circuit 600 includes a drain preventing circuit. As shown in the figure, TRC 600 includes, transistors M3 and M4, Schmidt trigger 540, capacitor C2, and memory circuit 550.

According to this embodiment, transistors M3 and M4 are connected in series. Transistor M3 has a drain connected to node 310, a source connected to the source of transistor M4, a gate connected to node 530, and a body connection connected to the source of transistor M3. Transistor M4 has a drain connected to node 520, a source connected to the source of transistor M3, a gate connected to node 530, and a body connection connected to the source of transistor M4. Schmidt trigger 540 is coupled between node 520 and node 530. A supply signal is coupled to node 310. A bias signal is coupled to node 520. Capacitor C2 is coupled between ground and node 520. The CLR pin of memory circuit 550 is coupled to node 530.

At startup of TRC 600, capacitor C2 begins charging to the bias signal. Initially, capacitor C2 has no stored charge such that the input of Schmidt trigger 540 is below a first trip point and Schmidt trigger 540 produces a high (logic "1") CLR signal at node 530. While the CLR signal at node 530 is high, transistors M3 and M4 do not have enough Vgs to conduct and are off. Similarly, the CLR pin of memory circuit 550 is held high by the high CLR signal at node 530, resetting memory circuit 550. When capacitor C2 is charged to the first trip level of Schmidt trigger 540, Schmidt trigger 540 produces a low (logic "0") CLR signal at node 530. Once the Schmidt trigger 540 produces a low CLR signal, the CLR pin of memory circuit 550 is held low, transistors M3 and M4 turn on (conduct) and couple the supply signal to node 520. Capacitor C2 charges to the supply signal while transistors M3 and M4 are on.

When a transient event occurs, and the supply signal collapses, capacitor C2 provides a secondary supply signal at node 520 and node 310, maintaining the input of Schmidt trigger 540 above the second trip point. The output of Schmidt trigger 540 is held low ensuring that the CLR pin of memory circuit 550 is not inadvertently reset. Accordingly, capacitor C2 should be sized to hold enough charge to maintain the secondary supply signal for the period of time of the transient event.

According to one embodiment, two P-channel FETs are used to help ensure that the channel-body diode does not drain current from capacitor C2. Using back-to-back transistors with the body connection connected to the source helps to ensure that any charging or discharging of capacitor C2 through the body path of the transistors is prevented.

According to another embodiment, transistors M3 and M4 may be replaced by a diode (not shown) and a one trip level inverter may replace Schmidt trigger 540. Similarly, although transistors M3 and M4 are shown as a P-channel FETs, transistors M3 and M4 may be NPN transistors, PNP transistors, Bipolar devices, MOS devices, GaAsFET devices, JFET devices, as well as one or more components that are arranged to provide the function of transistors M3 and M4 in the above described example.

Figure 7:
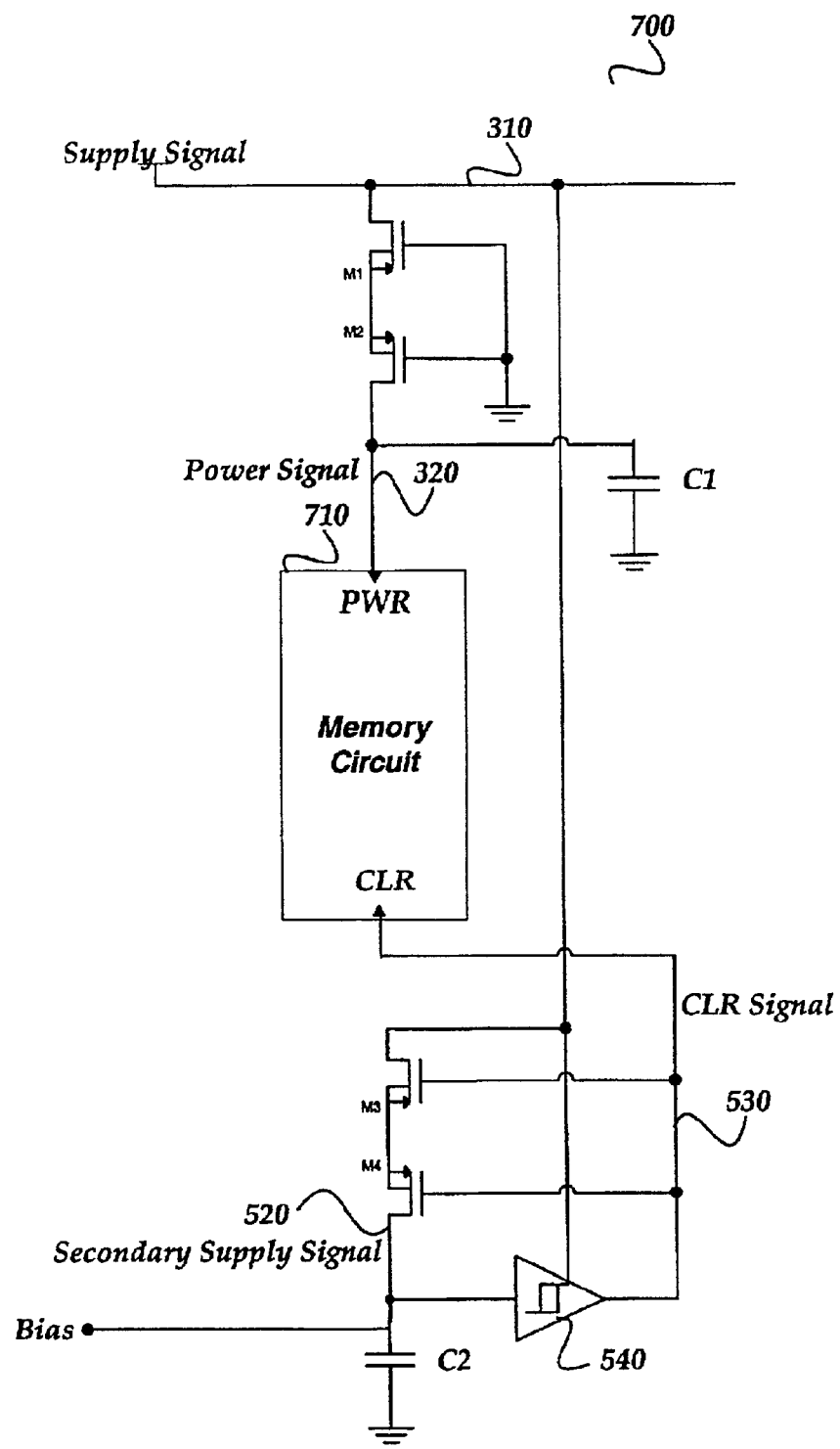
FIG. 7 shows a schematic diagram of a transient rejecting system for protecting two pins of a circuit.

FIG. 7 shows a schematic diagram of a TRC for protecting two pins of a memory circuit, according to one embodiment of the invention. As shown in the figure, TRC 700 includes transistors M1–M4, capacitors C1 and C2, Schmidt trigger 540, and memory circuit 710.

Transistor M1 and transistor M2 are connected in series. Transistor M1 has a drain connected to node 310, a source connected to the source of transistor M2, a gate connected to ground, and a body connection connected to the source of M1.

Transistor M2 has a source connected to the source of transistor M1, a drain connected to node 320, a gate connected to ground, and a body connection connected to the source of M2. A supply signal is coupled to node 310. Capacitor C1 is coupled between ground and node 320. The PWR pin of memory circuit 710 is coupled to node 320.

According to this embodiment, transistors M3 and M4 are connected in series. Transistor M3 has a drain connected to node 310, a source connected to the source of transistor M4, a gate connected to node 530, and a body connection connected to the source of transistor M3. Transistor M4 has a drain connected to node 520, a source connected to the source of transistor M3, a gate connected to node 530, and a body connection connected to the source of transistor M4. Schmidt trigger 540 is coupled between node 520 and node 530. A bias signal is coupled to node 520. Capacitor C2 is coupled between ground and node 520. The CLR pin of memory circuit 710 is coupled to node 530.

According to one embodiment of the invention, transistors M1, M2, M3, and M4 are P-channel FETs. During normal operation, transistors M1 and M2 are on (conducting) and are arranged to provide a power signal at node 320 received by capacitor C1 and the PWR pin of memory circuit 710. Capacitor C1 is charged to the supply line while M1 and M2 are on.

When a transient event occurs and the supply signal collapses, transistors M1 and M2 turn off because they do not have enough Vgs to conduct. During the transient event, capacitor C1 provides a power signal at node 320 sufficient to maintain the state of the PWR pin of memory circuit 710.

At startup of TRC 700, capacitor C2 begins charging to the bias signal. Initially, capacitor C2 has no stored charge such that the input of Schmidt trigger 540 is below a first trip point and Schmidt trigger 540 produces a high (logic "1") CLR signal at node 530. While the CLR signal at node 530 is high, transistors M3 and M4 do not have enough Vgs to conduct and are off. Similarly, the CLR pin of memory circuit 710 is held high by the high CLR signal at node 530, resetting memory circuit 710. When capacitor C2 is charged to the first trip level of Schmidt trigger 540, Schmidt trigger 540 produces a low (logic "0") CLR signal at node 530. Once the Schmidt trigger 540 produces a low CLR signal, the CLR pin of memory circuit 710 is held low, transistors M3 and M4 turn on (conduct) and couple the supply signal to node 520. Capacitor C2 charges to the supply signal while transistors M3 and M4 are on.

When a transient event occurs, and the supply signal collapses, capacitor C2 provides a secondary supply signal at node 520 and node 310, maintaining the input of Schmidt trigger 540 above the second trip point. The output of Schmidt trigger 540 is held low ensuring that the CLR pin of memory circuit 710 is not inadvertently reset. Accordingly, capacitor C2 should be sized to hold enough charge to maintain the secondary supply signal for the period of time of the transient event.

According to one embodiment, two P-channel FETs are connected in series (M1 and M2, and M3 and M4) to help ensure that the channel-body diode does not drain current from capacitor C1 or C2. Using back-to-back transistors with the body connection connected to the source helps to ensure that any charging or discharging of capacitor C1 or C2 through the body path of the transistors is prevented.

According to another embodiment, transistors M1 and M2 may be replaced by a diode, transistors M3 and M4 may be replaced by a diode (not shown) and Schmidt trigger 540 may be replaced by an inverter. Although transistors M1, M2, M3, and M4 are shown as P-channel FETs, they may be NPN transistors, PNP transistors, Bipolar devices, MOS devices, GaAsFET devices, JFET devices, as well as one or more components that are arranged to provide the function of transistors M1, M2, M3, and M4 in the above described example.

Figure 8:
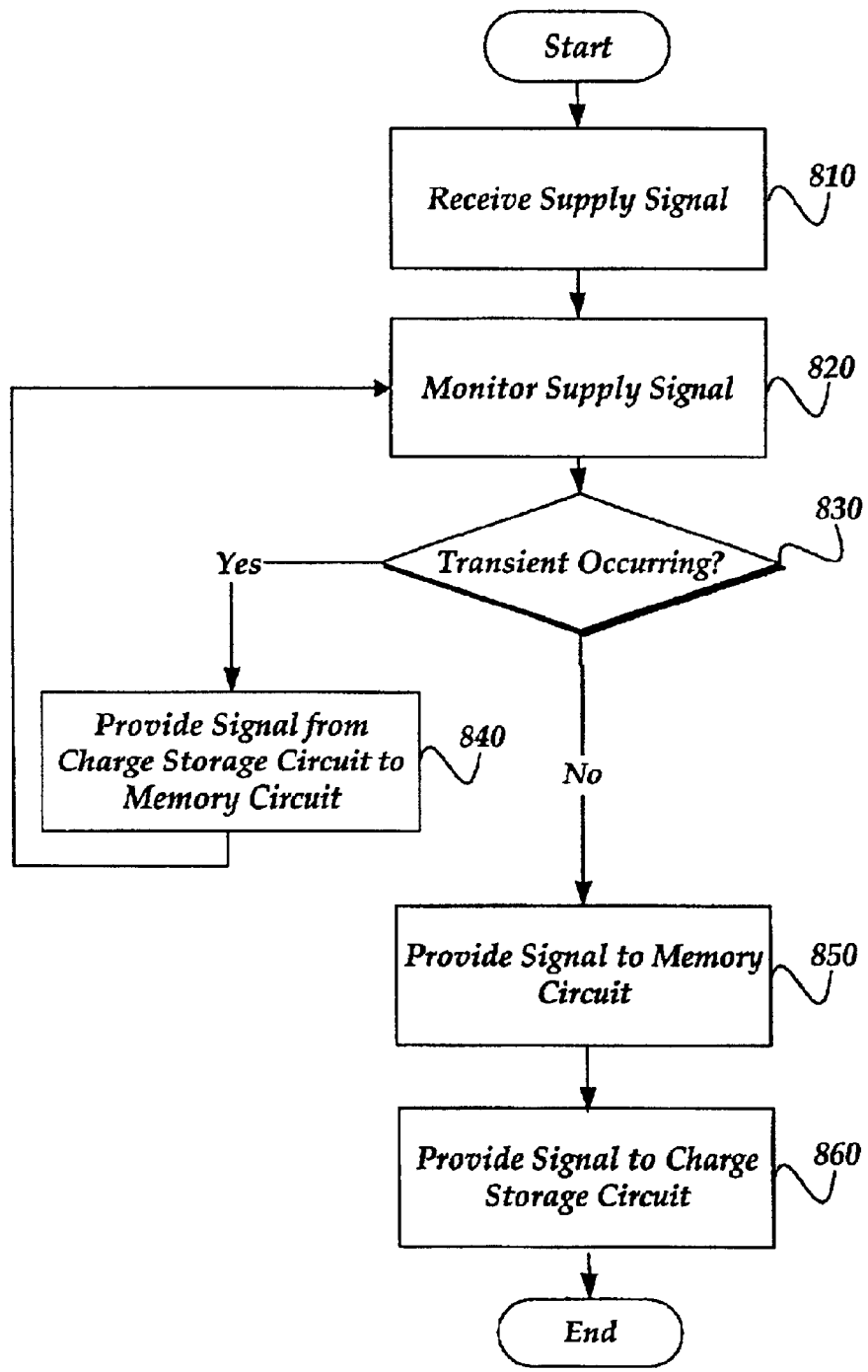
FIG. 8 illustrates a logical flow diagram of the operation a transient rejecting system.

FIG. 8 shows a logical flow diagram of operation of a transient rejecting system 800, according to one embodiment of the invention. After a start block, the logic flows to a block 810 at which point a supply signal is received. Moving to a block 820, the supply signal is monitored for transients. Transitioning to a decision block 830, a determination is made as to whether a transient event is occurring.

When a transient event is occurring, the logic flows to a block 840 at which point the logic directs a charge storage circuit to supply a sufficient signal to the memory circuit in order for it to maintain its state. The logical flow then ends.

During normal operation, the logic flows to a block 850 where a signal is provided to the memory circuit. Next, at block 860, a signal is supplied to the charge storage circuit so that the charge storage circuit may charge. The logical flow then returns to block 820 to continue monitoring the signal. The logical flow then ends.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for protecting a circuit from a transient event, comprising:
   a signal transfer circuit comprising a transistor having a first non-control terminal that is arranged to receive a supply signal, a control terminal that is coupled to ground, and a second non-control terminal that is arranged to output a first signal during normal operation to a pin of the circuit and to a charge storage circuit, wherein the circuit is powered by the first signal during normal operation, and comprising a second transistor arranged to prevent drain from the charge storage circuit through a body diode of the second transistor;
   the charge storage circuit arranged to receive the first signal during normal operation and output a second signal to provide power during the transient event to the pin of the circuit, the charge storage circuit storing enough charge to provide the second signal during the transient event, wherein the circuit is powered by the second signal during the transient event.

2. An apparatus for protecting a circuit from a transient event, comprising:
   a signal transfer circuit arranged to receive a supply signal and output a first signal that determines a logic state of an input pin of the circuit during normal operation;
   a charge storage circuit arranged to receive a bias signal and the first signal, the charge storage circuit providing a second signal that determines the logic state of the input pin of the circuit during the transient event; and
   an inverting circuit arranged to receive the first signal, the second signal, and the bias signal, the inverting circuit coupled to the input pin of the circuit, the inverting circuit arranged to hold the input pin of the circuit high during a start up of the circuit, and low during the transient event and during normal operation.

3. The apparatus of claim 2, wherein the inverting circuit is a Schmidt trigger.

4. The apparatus of claim 2, wherein the charge storage circuit is a capacitor circuit.

5. The apparatus of claim 2, wherein the signal transfer circuit is a diode circuit.

6. The apparatus of claim 2, wherein the signal transfer circuit is a transistor circuit.

7. The apparatus of claim 6, wherein the transistor circuit, further comprises a first transistor and a second transistor arranged to prevent drain from the charge storage circuit.

8. An apparatus for protecting a circuit from a transient event, comprising:
   a signal transfer circuit arranged to receive a supply signal and output a first signal during normal operation;
   a charge storage circuit arranged to receive a bias signal and the first signal, the charge storage circuit providing a second signal that determines a logic state of an input pin of the circuit during the transient event; and
   an inverting circuit arranged to receive the first signal, the second signal, and the bias signal, the inverting circuit coupled to the input pin of the circuit, the inverting circuit arranged to hold the input pin of the circuit high during a startup of the circuit, and low during the transient event and during normal operation, wherein the inverting circuit is a Schmidt trigger.

9. The apparatus of claim 8, wherein the charge storage circuit is a capacitor circuit.

10. The apparatus of claim 8, wherein the signal transfer circuit is a diode circuit.

11. The apparatus of claim 8, wherein the signal transfer circuit is a transistor circuit.

12. The apparatus of claim 11, wherein the transistor circuit, further comprises a first transistor and a second transistor arranged to prevent drain from the charge storage circuit.

13. A method for protecting a circuit from a transient event, comprising:
   receiving a supply signal and generating in response a first signal that determines a logic state of an input pin of the circuit during normal operation;
   charging a charge storage circuit in response to the generated first signal and providing a second signal that determines the logic state of the input pin of the circuit during the transient event; and
   generating an output signal for driving the logic state of the input pin in response to the first signal, the second signal, and a bias signal, such that the input pin of the circuit is held high during a startup of the circuit, and held low during the transient event and during normal operation.

14. An apparatus for protecting a circuit from a transient event, comprising:
   means for receiving a supply signal and generating in response a first signal that determines a logic state of an input pin of the circuit during normal operation;
   means for storing a charge in response to the generated first signal and providing a second signal that determines the logic state of the input pin of the circuit during the transient event; and means for generating an output signal for driving the logic state of the input pin in response to the first signal, the second signal, and a bias signal, such that the input pin of the circuit is held high during a startup of the circuit, and held low during the transient event and during normal operation.

* * * * *

UNITED STATES PATENT AND TRADEMARK OFFICE
CERTIFICATE OF CORRECTION

PATENT NO. : 6,768,355 B1
DATED : November 12, 2004
INVENTOR(S) : Paul M. Henry et al.

It is certified that error appears in the above-identified patent and that said Letters Patent is hereby corrected as shown below:

Title page,
Item "[73] Assignee: National Semiconductor Corporation, Santa Clara, CA (US)" should read
-- [73] Assignee: National Semiconductor Corporation, Santa Clara, CA (US); and Motorola, Inc., Schaumburg, IL (US) --.

Column 6,
Lines 63 and 64, "not inadvertently rest" should read -- not inadvertently reset --.

Signed and Sealed this

Twenty-third Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,768,355 B1
DATED : July 27, 2004
INVENTOR(S) : Paul M. Henry et al.

It is certified that error appears in the above-identified patent and that said Letters Patent is hereby corrected as shown below:

Title page,
Item [73], Assignee, "National Semiconductor Corporation, Santa Clara, CA (US)" should read -- National Semiconductor Corportion, Santa Clara, CA (US); and Motorola, Inc., Schaumburg, IL (US) --.

Column 6,
Line 63 and 64, "not inadvertently rest" should read -- not inadvertently reset --.

This certificate supersedes Certificate of Correction issued August 23, 2005.

Signed and Sealed this

Seventh Day of February, 2006

JON W. DUDAS
*Director of the United States Patent and Trademark Office*